United States Patent
Jing

(10) Patent No.: US 10,093,536 B2
(45) Date of Patent: Oct. 9, 2018

(54) MEMS DOUBLE-LAYER SUSPENSION MICROSTRUCTURE MANUFACTURING METHOD, AND MEMS INFRARED DETECTOR

(71) Applicant: CSMC TECHNOLOGIES FAB2 CO., LTD., Wuxi New District, Jiangsu (CN)

(72) Inventor: Errong Jing, Jiangsu (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 15/573,280

(22) PCT Filed: May 10, 2016

(86) PCT No.: PCT/CN2016/081522
§ 371 (c)(1),
(2) Date: Nov. 10, 2017

(87) PCT Pub. No.: WO2016/180311
PCT Pub. Date: Nov. 17, 2016

(65) Prior Publication Data
US 2018/0134548 A1      May 17, 2018

(30) Foreign Application Priority Data
May 13, 2015     (CN) .......................... 2015 1 0244071

(51) Int. Cl.
*G01J 5/00*     (2006.01)
*B81C 1/00*     (2006.01)
(Continued)

(52) U.S. Cl.
CPC ............ *B81C 1/00182* (2013.01); *B81B 7/02* (2013.01); *B81C 1/00* (2013.01); *B81C 1/00476* (2013.01);
(Continued)

(58) Field of Classification Search
CPC .. G01J 5/022; G01J 5/023; G01J 5/024; G01J 5/0853; G01J 5/12; G01J 5/046; G01J 5/16; G01J 5/126; H01L 31/18
See application file for complete search history.

(56) References Cited

U.S. PATENT DOCUMENTS 6,031,231 A      2/2000   Kimata et al.
6,329,738 B1 *  12/2001   Hung .................... B81B 3/0037
                                                      310/309
(Continued)

FOREIGN PATENT DOCUMENTS

CN       102244190 A      11/2011
CN       102386268 A       3/2012
(Continued)

OTHER PUBLICATIONS

International Search Report dated Aug. 16, 2016 issued in corresponding International Application No. PCT/CN2016/081522, 9 Pages.
(Continued)

*Primary Examiner* — Kiho Kim
(74) *Attorney, Agent, or Firm* — Scott Watkins

(57) ABSTRACT

An MEMS double-layer suspension microstructure manufacturing method, comprising: providing a substrate; forming a first dielectric layer on the substrate; patterning the first dielectric layer to prepare a first film body and a cantilever beam connected to the first film body; forming a sacrificial layer on the first dielectric layer; patterning the sacrificial layer located on the first film body to make a recess portioned portion for forming a support structure, with the first film body being exposed at the bottom of the recess portioned portion; forming a second dielectric layer on the sacrificial layer; patterning the second dielectric layer to make the second film body and the support structure, with the support structure being connected to the first film body
(Continued)

and the second film body; and removing part of the substrate under the first film body and removing the sacrificial layer to obtain the MEMS double-layer suspension microstructure.

10 Claims, 3 Drawing Sheets

(51) Int. Cl.
  *B81B 7/02* (2006.01)
  *G01J 5/20* (2006.01)
(52) U.S. Cl.
  CPC ......... *G01J 5/20* (2013.01); *B81C 2201/0108* (2013.01); *B81C 2201/0109* (2013.01); *B81C 2201/0132* (2013.01)

(56) References Cited

U.S. PATENT DOCUMENTS

| | | | |
|---|---|---|---|
| 2004/0200962 | A1 | 10/2004 | Ishikawa et al. |
| 2007/0272864 | A1* | 11/2007 | Li .............................. G01J 5/40 250/338.4 |
| 2009/0231673 | A1* | 9/2009 | Oden ................. G02B 26/0841 359/291 |
| 2010/0270892 | A1* | 10/2010 | Ahn ....................... H01L 41/094 310/368 |
| 2011/0156537 | A1* | 6/2011 | Fujii ................... B81C 1/00976 310/330 |
| 2012/0025334 | A1* | 2/2012 | Chan ..................... H04R 19/005 257/416 |
| 2013/0248712 | A1* | 9/2013 | Abdolvand ............. G01J 5/022 250/338.1 |

FOREIGN PATENT DOCUMENTS

| | | |
|---|---|---|
| CN | 102829880 A | 12/2012 |
| CN | 102889933 A | 1/2013 |
| CN | 102901567 A | 1/2013 |
| JP | 11142237 A | 5/1999 |

OTHER PUBLICATIONS

Office Action dated May 3, 2017 issued in the correspondence Chinese Patent Application No. 201510244071.0, pp. 1-6.

* cited by examiner

US 10,093,536 B2

MEMS DOUBLE-LAYER SUSPENSION MICROSTRUCTURE MANUFACTURING METHOD, AND MEMS INFRARED DETECTOR

CROSS REFERENCE TO RELATED APPLICATIONS

This application is a National Phase filing under 35 U.S.C. § 371 of PCT/CN2016/081522 filed on May 10, 2016; and this application claims priority to Chinese Application No. 201510244071.0 filed on May 13, 2015, under 35 U.S.C. § 119. The entire contents of each application are hereby incorporated by reference.

FIELD OF THE INVENTION

The present disclosure relates to a technical field of semiconductor devices, and more particular relates to a method of fabricating a micro-electro-mechanical system (MEMS) double-layer suspended microstructure, and an MEMS infrared detector.

BACKGROUND OF THE INVENTION

MEMS is a micro-integrated system that fabricated by fabricating microstructures, microsensors, microactuators, control processing circuits, and even interfaces and power supplies on one or more chips using integrated circuit (IC) fabrication technology and microfabrication technology. Compared with conventional infrared detectors, infrared detectors fabricated using MEMS technology have obvious advantages in terms of volume, power consumption, weight, price, and so on. Nowadays, infrared detectors fabricated using MEMS technology are widely used in military and civilian fields. According to different working principles, infrared detectors are mainly classified into thermopile detectors, pyroelectric detectors, thermistor detectors, and so on. The thermopile infrared detector converts a temperature change caused by infrared radiation into a voltage signal according to the Seebeck effect, and then outputs the voltage signal. The pyroelectric infrared detector measures the temperature change caused by infrared radiation by accumulation of electric charges in a heated object. The thermistor infrared detector measures the temperature change caused by infrared radiation by reading a change in resistance of a resistor. At present, MEMS infrared detectors are generally single-layer suspended microstructure, of which a process is very simple, but when a size of an infrared detector chip is reduced, a suspended absorption region (film absorption layer) used to absorb infrared radiation will be correspondingly reduced, which will greatly reduce an infrared response rate of an infrared detector.

SUMMARY OF THE INVENTION

Accordingly, it is necessary to provide a method of fabricating an MEMS double-layer suspended microstructure using which can fabricate an infrared detector with a high infrared response rate. In addition, an MEMS infrared detector is provided.

A method of fabricating an MEMS double-layer suspended microstructure includes:
providing a substrate;
forming a first dielectric layer on the substrate;
patterning the first dielectric layer to form a first film body and a cantilever beam connected to the first film body;
forming a sacrificial layer on the first dielectric layer;
patterning the sacrificial layer on the first film body to fabricate a recess portion for forming a support structure, and the first film body being exposed at a bottom of the recess portion;
forming a second dielectric layer on the sacrificial layer;
patterning the second dielectric layer to form a second film body and the support structure, and the support structure connecting the first film body and the second film body; and
removing a part of the substrate under the first film body, removing the sacrificial layer, and obtaining the MEMS double-layer suspended microstructure.

An MEMS infrared detector includes an MEMS double-layer suspended microstructure fabricated by the aforementioned method of fabricating the MEMS double-layer suspended microstructure.

A suspended microstructure with double layers can be fabricated using the aforementioned method of fabricating the MEMS double-layer suspended microstructure. Since a fabrication of a cantilever beam is not needed for the second film body, the second film body can be fabricated to be larger than the first film body, thus the infrared detector fabricated using the double-layer suspended microstructure (the suspended microstructure having the first film body and the second film body) can have a larger suspended absorption region than an infrared detector of a single-layer suspended microstructure, and a higher infrared response rate. When the size of the infrared detector chip is reduced, in contrast to the conventional infrared detector of a single-layer suspended microstructure, though the suspended absorption region (the second film body) used to absorb infrared radiation will be correspondingly reduced, since the fabrication of a cantilever beam is not needed for the second film body, the second film body can be fabricated to be larger than the first film body, therefore, even when the size of the infrared detector chip is reduced, the infrared detector can have a larger suspended absorption region than an infrared detector of a single-layer suspended microstructure, such that the infrared response rate will be greatly improved compared with the conventional infrared detector of a single-layer suspended microstructure.

DETAILED DESCRIPTION OF THE EMBODIMENTS

Embodiments of the disclosure are described more fully hereinafter with reference to the accompanying drawings. The various embodiments of the disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

Unless otherwise defined, all terms (including technical and scientific terms) used herein have the same meaning as commonly understood by one of ordinary skill in the art to which this disclosure belongs. The terms used herein in the specification of the present disclosure are for the purpose of describing the embodiments only and are not intended to limit the invention. As used herein, the term "and/or" includes any and all combinations of one or more of the associated listed items.

Figure 1:
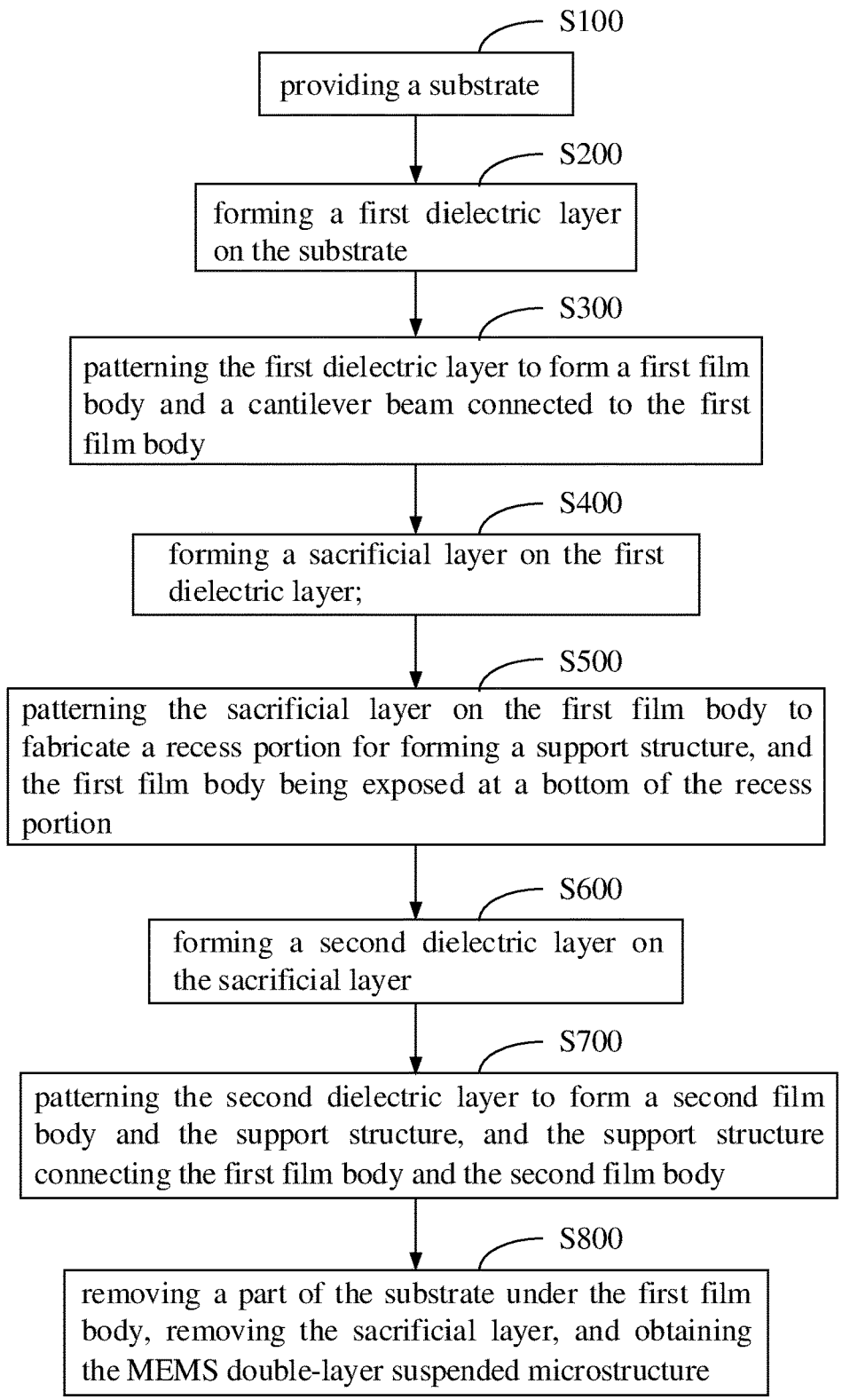
FIG. 1 is a flow chart of a method of fabricating an MEMS double-layer suspended microstructure according to an embodiment.

FIG. 1 is a flow chart of a method of fabricating an MEMS double-layer suspended microstructure according to an embodiment.

A method of fabricating a micro-electro-mechanical system (MEMS) double-layer suspended microstructure includes the steps of:

In step S100: a substrate 100 is provided. The substrate 100 can be a substrate having a circuit structure provided thereon.

Figure 2:
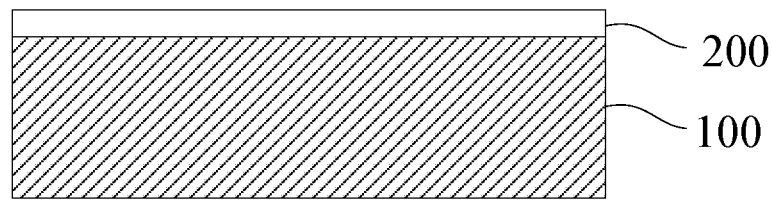
FIG. 2 is a side elevational view after the first dielectric layer is patterned.
Figure 3:
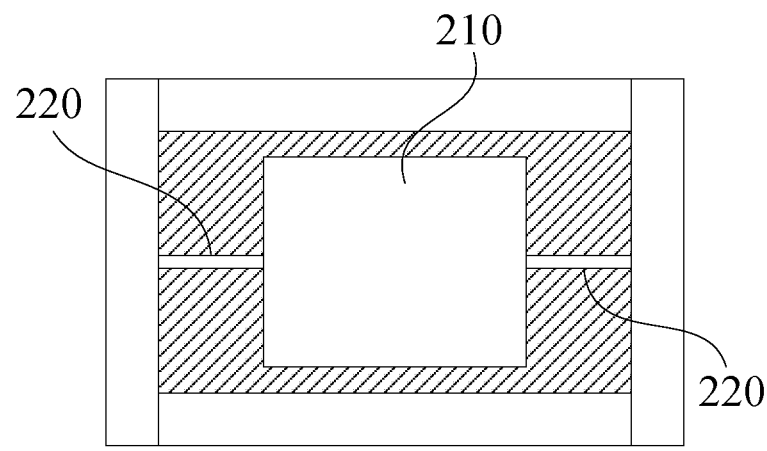
FIG. 3 is a top plan view after the first dielectric layer is patterned.

In step S200: a first dielectric layer 200 is formed on the substrate 100. The first dielectric layer 200 is formed by a deposition process, and a thickness of the first dielectric layer 200 is from 100 nm to 2000 nm. The first dielectric layer 200 can be made of silicon dioxide, silicon nitride, silicon oxynitride, a combination of two laminated layers of above materials, or a combination of three laminated layers of above materials. In other words, the first dielectric layer 200 can be a single-layer structure of a silicon dioxide layer, or a silicon nitride layer, or a silicon oxynitride layer; or a non-single-layer structure of a combination and lamination of two or three of a silicon dioxide layer, a silicon nitride layer, and a silicon oxynitride layer. In the present embodiment, the first dielectric layer 200 is made of silicon dioxide. FIG. 2 is a side elevational view after the first dielectric layer is patterned. FIG. 3 is a top plan view after the first dielectric layer is patterned.

In step S300: the first dielectric layer 200 is patterned to form a first film body 210 and a cantilever beam 220 connecting the substrate 100 and the first film body 210. Referring to FIG. 3, in the present embodiment, there are two cantilever beams 220 located on opposite sides of the first film body 210, respectively. The cantilever beams 220 are thin and a contact area with the substrate 100 is much smaller than the infrared absorption region (the first film body 210 herein), such that the infrared energy is prevented from being quickly absorbed by the substrate 100.

In step S400: a sacrificial layer 300 is formed on the first dielectric layer 200. The sacrificial layer 300 can be made of one of polyimide and amorphous silicon. When polyimide is selected, the sacrificial layer 300 is formed by coating; when amorphous silicon is selected, the sacrificial layer 300 is formed by a deposition process. A thickness of the sacrificial layer 300 is from 500 nm to 3000 nm.

Figure 4:
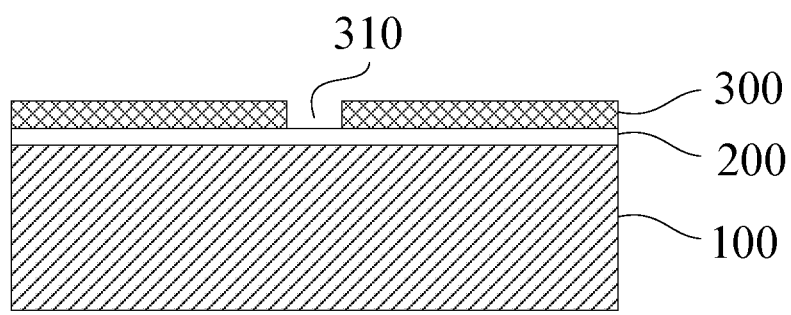
FIG. 4 is a side elevational view after the sacrificial layer is patterned.
Figure 5:
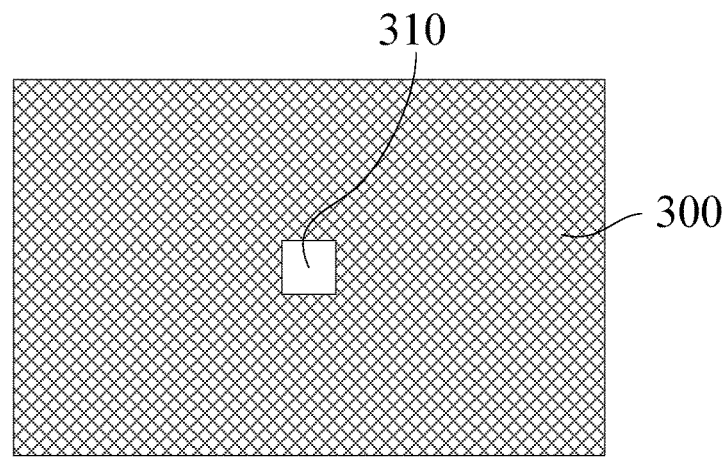
FIG. 5 is a top plan view after the sacrificial layer is patterned.

In step S500: the sacrificial layer 300 on the first film body 210 is patterned to fabricate a recess portion 310 for forming a support structure, and the first film body 210 is exposed at a bottom of the recess portion 310. Referring to FIG. 4 and FIG. 5, in the present embodiment, there is one recess portion 310 located at the central position of the sacrificial layer on the first film body 210 and exposed above the first film body 210. FIG. 4 is a side elevational view after the sacrificial layer is patterned. FIG. 5 is a top plan view after the sacrificial layer is patterned.

Figure 6:
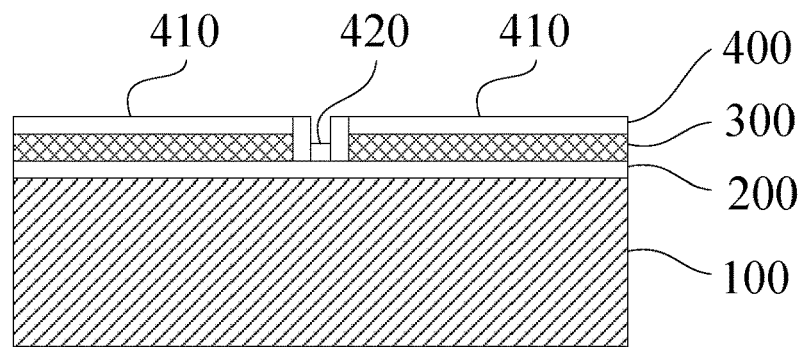
FIG. 6 is a side elevational view after the second dielectric layer is formed.

In step S600: a second dielectric layer 400 is formed by deposition on the sacrificial layer 300. A thickness of the second dielectric layer 400 is from 100 nm to 2000 nm. The second dielectric layer 400 can be made of silicon dioxide, silicon nitride, silicon oxynitride, a combination of two laminated layers of above materials, or a combination of three laminated layers of above materials. In other words, the second dielectric layer 400 can be a single-layer structure of a silicon dioxide layer, or a silicon nitride layer, or a silicon oxynitride layer; or a non-single-layer structure of a combination and lamination of two or three of a silicon dioxide layer, a silicon nitride layer, and a silicon oxynitride layer. In the present embodiment, the second dielectric layer 400 is made of silicon dioxide. FIG. 6 is a side elevational view after the second dielectric layer is formed.

In step S700: the second dielectric layer 400 is patterned to form a second film body 410 and the support structure 420, and the support structure 420 connects the first film body 210 and the second film body 410. The dielectric layer deposited and patterned on the recess 310 of the sacrificial layer 300 is regarded as the support structure 420. The second film body 410 is formed by connecting regions surrounding the support structure 420 together. Referring to FIG. 6, since a fabrication of a cantilever beam is not needed for the second film body 410, a projected area of the second film body 410 in the horizontal direction can be greater than a projected area of the first film body 210 in the horizontal direction. The second film body 410 is fixed to the first film body 210 by the sacrificial layer 300.

Figure 7:
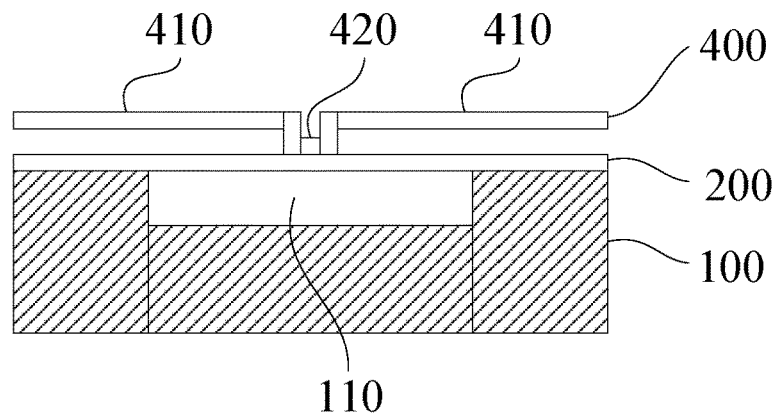
FIG. 7 is a schematic diagram of the MEMS double-layer suspended microstructure.

In step S800: the MEMS double-layer suspended microstructure is obtained by removing a part 110 of the substrate under the first film body 210 and removing the sacrificial layer 300, as shown in FIG. 7. When the sacrificial layer 300 is made of amorphous silicon, the part 110 of the substrate under the first film body 210 and the sacrificial layer 300 can be etched and removed by a dry etching process; when the sacrificial layer 300 is made of polyimide, first the part 110 of the substrate under the first film body 210 can be etched and removed by the dry etching process from the back of the substrate 100, then the sacrificial layer 300 can be removed by an oxygen plasma dry etching process, thus the MEMS double-layer suspended microstructure is obtained. Amorphous silicon, or the part 110 of the substrate under the first film body 210 can be removed by a gas phase xenon fluoride dry etching process (e.g., xenon difluoride XeF2) or a deep reactive-ion etching (DRIE) process.

The working principle of the oxygen plasma dry etching process is to introduce a small amount of oxygen into a vacuum system, and apply a high voltage to ionize the oxygen to form an oxygen plasma glow column. Reactive oxygen species (ROS) can quickly oxidize polyimides and generate volatile gases to achieve etch. In other embodiments, all kinds of materials that can be removed by a semiconductor etching process can replace the polyimide to be a sacrificial layer in the present method. The semiconductor etching process includes, of course, an etching process using ions, gases, or light to etch, such as an oxygen ion dry etching process.

Both the first film body 210 and the second film body 410 (mainly rely on the second film body 410) of an MEMS infrared detector fabricated using the aforementioned MEMS double-layer suspended microstructure are film absorption layers that can be used to absorb the infrared radiation, and an electrical signal converted from absorbed infrared energy is transmitted through the cantilever beams 220 to the circuit structure of the substrate 100.

The present disclosure further discloses an MEMS infrared detector, which includes the MEMS double-layer suspended microstructure fabricated by the aforementioned method of fabricating the MEMS double-layer suspended microstructure. The MEMS infrared detector can be, for example, a thermistor infrared detector.

It should be understood that although the steps in the flow chart of FIG. 1 are sequentially displayed as indicated by the arrows, these steps are not necessarily sequentially performed in the order indicated by the arrows. Unless expressly stated herein, the execution of these steps is not strictly restrictive and may be performed in other order. Moreover, at least a portion of the steps in FIG. 1 may include a plurality of sub-steps or stages, which are not necessarily executed at the same time and may be executed at different times, and the order of execution thereof is not necessarily sequential, but may be performed in turn or alternately with at least a portion of the other steps, sub-steps or stages of the other steps.

It should be understood that only some of the major steps of the aforementioned method of fabricating the MEMS double-layer suspended microstructure are describes herein and they do not represent all the steps of the method of fabricating the MEMS double-layer suspension microstructure. The illustrations in FIGS. 2 to 7 are also simple examples of some of the major constructions of the device during the fabrication of MEMS double-layer suspended microstructures and do not represent the overall structure of the device.

A suspended microstructure with double layers can be fabricated using the aforementioned method of fabricating the MEMS double-layer suspended microstructure. Since a fabrication of a cantilever beam is not needed for the second film body, the second film body can be fabricated to be larger than the first film body, thus the infrared detector fabricated using the double-layer suspended microstructure (the suspended microstructure having the first film body and the second film body) can have a larger suspended absorption region than an infrared detector of a single-layer suspended microstructure, and a higher infrared response rate. When the size of the infrared detector chip is reduced, in contrast to the conventional infrared detector of a single-layer suspended microstructure, though the suspended absorption region (the second film body) used to absorb infrared radiation will be correspondingly reduced, since the fabrication of a cantilever beam is not needed for the second film body, the second film body can be fabricated to be larger than the first film body. Therefore, even when the size of the infrared detector chip is reduced, the infrared detector can have a larger suspended absorption region than an infrared detector of a single-layer suspended microstructure, such that the infrared response rate will be greatly improved compared with the conventional infrared detector of a single-layer suspended microstructure.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A method of fabricating a micro-electro-mechanical system (MEMS) double-layer suspended microstructure, comprising:
   providing a substrate;
   forming a first dielectric layer on the substrate;
   patterning the first dielectric layer to form a first film body and a cantilever beam connected to the first film body;
   forming a sacrificial layer on the first dielectric layer;
   patterning the sacrificial layer on the first film body to fabricate a recess portion for forming a support structure, and the first film body being exposed at a bottom of the recess portion;
   forming a second dielectric layer on the sacrificial layer;
   patterning the second dielectric layer to form a second film body and the support structure, and the support structure connecting the first film body and the second film body; and
   removing a part of the substrate under the first film body, removing the sacrificial layer, and obtaining the MEMS double-layer suspended microstructure.

2. The method of claim 1, wherein the part of the substrate under the first film body is removed by a dry etching process.

3. The method of claim 1, wherein the part of the substrate under the first film body is removed by a gas phase xenon fluoride dry etching process or a deep reactive-ion etching process.

4. The method of claim 1, wherein the sacrificial layer is a polyimide layer, and the sacrificial layer is removed by an oxygen plasma dry etching process; or
   the sacrificial layer is made of amorphous silicon, and the sacrificial layer is removed by a dry etching process.

5. The method of claim 1, wherein a thickness of the sacrificial layer is from 500 nm to 3000 nm.

6. The method of claim 1, wherein thicknesses of both the first dielectric layer and the second dielectric layer are from 100 nm to 2000 nm.

7. The method of claim 1, wherein the first dielectric layer and the second dielectric layer are made of silicon dioxide, silicon nitride, silicon oxynitride, a combination of two laminated layers of above materials, or a combination of three laminated layers of above materials.

8. The method of claim 1, wherein the number of the cantilever beams is two, and the two cantilever beams are located on opposite sides of the first film body, respectively.

9. The method of claim 1, wherein a projected area of the second film body in the horizontal direction is greater than a projected area of the first film body in the horizontal direction.

10. An MEMS infrared detector, comprising an MEMS double-layer suspended microstructure fabricated by the method of fabricating the MEMS double-layer suspended microstructure of claim 1.

* * * * *